US012554284B2

(12) United States Patent
Lee et al.

(10) Patent No.: US 12,554,284 B2
(45) Date of Patent: Feb. 17, 2026

(54) DISPLAY DEVICE

(71) Applicant: LG ELECTRONICS INC., Seoul (KR)

(72) Inventors: Jaehun Lee, Seoul (KR); Jonggil Pyo, Seoul (KR); Chulki Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 76 days.

(21) Appl. No.: 18/287,782

(22) PCT Filed: Feb. 16, 2022

(86) PCT No.: PCT/KR2022/002273
§ 371 (c)(1),
(2) Date: Oct. 20, 2023

(87) PCT Pub. No.: WO2023/146014
PCT Pub. Date: Aug. 3, 2023

(65) Prior Publication Data
US 2024/0184326 A1   Jun. 6, 2024

(30) Foreign Application Priority Data
Jan. 26, 2022   (KR) ........................ 10-2022-0011775

(51) Int. Cl.
*G06F 1/16*   (2006.01)
*H10K 77/10*   (2023.01)
*H10K 102/00*   (2023.01)

(52) U.S. Cl.
CPC .......... *G06F 1/1601* (2013.01); *H10K 77/111* (2023.02); *H10K 2102/311* (2023.02)

(58) Field of Classification Search
CPC ...... G06F 1/1601; G06F 1/1652; G09F 9/301; G09F 9/30; H10K 77/111; H10K 77/10;
(Continued)

(56) References Cited

U.S. PATENT DOCUMENTS 10,020,462 B1 *   7/2018   Ai .................... H10K 50/841
10,290,240 B2 *   5/2019   Kang ................... H10K 50/84
(Continued)

FOREIGN PATENT DOCUMENTS

CN   209216457 U   8/2019
JP   2015-210521 A   11/2015
(Continued)

*Primary Examiner* — Dimary S Lopez Cruz
(74) *Attorney, Agent, or Firm* — Birch, Stewart, Kolasch & Birch, LLP

(57) ABSTRACT

Disclosed is display device. The display device includes: a flexible display panel; a flexible rear plate which is located in a rear of the display panel, and coupled to the display panel; a flexible inner plate coupled to the rear plate, at between the rear plate and the display panel; a driving module which is coupled to a rear of the rear plate, and has a slider linearly reciprocating; a wing which extends long, has one end coupled to the slider, has the other end coupled to the rear of the rear plate, and has a pivot shaft located adjacent to the one end at between the first end and the other end; and a wing bracket which is adjacent to the pivot shaft and fixed to the rear of the rear plate, coupled to the pivot shaft, wherein the inner plate comprises a plurality of cutting lines which are located between one end and the other end of the wing, and formed by cutting out a front surface of the inner plate, wherein the plurality of cutting lines are elongated in a direction intersecting a longitudinal direction of the wing.

11 Claims, 24 Drawing Sheets

(58) Field of Classification Search
CPC .............. H01K 2102/311; F16H 25/20; H05K 5/0217; H05K 5/0226
See application file for complete search history.

(56) References Cited

U.S. PATENT DOCUMENTS

| | | | |
|---|---|---|---|
| 10,582,612 B2* | 3/2020 | Kwon | G06F 1/1626 |
| 10,917,985 B1 | 2/2021 | Lee et al. | |
| 11,216,039 B2* | 1/2022 | Jan | G06F 1/1681 |
| 2017/0013728 A1 | 1/2017 | Lee et al. | |
| 2017/0347466 A1 | 11/2017 | Kang et al. | |
| 2022/0256020 A1* | 8/2022 | Liu | H01M 50/20 |

FOREIGN PATENT DOCUMENTS

| | | |
|---|---|---|
| KR | 10-2014-0117182 A | 10/2014 |
| KR | 10-2015-0020895 A | 2/2015 |
| KR | 10-2015-0062098 A | 6/2015 |
| KR | 10-2015-0081228 A | 7/2015 |
| KR | 10-2015-0109046 A | 10/2015 |
| KR | 10-2015-0122511 A | 11/2015 |
| KR | 10-2016-0016334 A | 2/2016 |
| KR | 10-2016-0036805 A | 4/2016 |
| KR | 10-2016-0050689 A | 5/2016 |
| KR | 10-2017-0005535 A | 1/2017 |
| KR | 10-1720178 B1 | 3/2017 |
| KR | 10-2020-0114915 A | 10/2020 |
| KR | 10-2183884 B1 | 11/2020 |
| KR | 10-2187746 B1 | 12/2020 |
| KR | 10-2022-0008593 A | 1/2022 |

\* cited by examiner

DISPLAY DEVICE

CROSS REFERENCE TO RELATED APPLICATIONS

This application is the National Phase of PCT International Application No. PCT/KR2022/002273, filed on Feb. 16, 2022, which claims priority under 35 U.S.C. 119 (a) to Patent Application No. 10-2022-0011775, filed in the Republic of Korea on Jan. 26, 2022, all of which are hereby expressly incorporated by reference into the present application.

TECHNICAL FIELD

The present disclosure relates to a display device. More specifically, the present disclosure relates to a display device capable of changing the curvature of a display panel.

BACKGROUND ART

As the information society develops, the demand for display devices is also increasing in various forms. In response to this, various display devices such as Liquid Crystal Display Device (LCD), Electroluminescent Display (ELD), Vacuum Fluorescent Display (VFD), and Organic Light Emitting Diode (OLED) have been researched and used in recent years.

Among them, an OLED panel may display an image by depositing an organic material layer capable of self-emitting light on a substrate on which a transparent electrode is formed. An OLED panel may have a thin thickness and may have a flexible characteristic. A lot of research has been conducted on a structural characteristic of a display device having such an OLED panel.

DISCLOSURE

Technical Problem

An object of the present disclosure is to solve the above problems and other problems.

Another object of the present disclosure is to provide a structure capable of freely changing the curvature of a display panel.

Another object of the present disclosure is to provide a mechanism to freely change the curvature of a display.

Another object of the present disclosure is to provide a display device that can be curved with a certain curvature.

Technical Solution

In accordance with an aspect of the present disclosure, there is provided a flexible display panel; a flexible rear plate which is located in a rear of the display panel, and coupled to the display panel; a flexible inner plate coupled to the rear plate, at between the rear plate and the display panel; a driving module which is coupled to a rear of the rear plate, and has a slider linearly reciprocating; a wing which extends long, has one end coupled to the slider, has the other end coupled to the rear of the rear plate, and has a pivot shaft located adjacent to the one end at between the first end and the other end; and a wing bracket which is adjacent to the pivot shaft and fixed to the rear of the rear plate, coupled to the pivot shaft, wherein the inner plate comprises a plurality of cutting lines which are located between one end and the other end of the wing, and formed by cutting out a front surface of the inner plate, wherein the plurality of cutting lines are elongated in a direction intersecting a longitudinal direction of the wing.

Advantageous Effects

According to at least one embodiment of the present disclosure, a structure capable of freely changing the curvature of a display panel may be provided.

According to at least one embodiment of the present disclosure, a mechanism to freely change the curvature of a display may be provided.

According to at least one embodiment of the present disclosure, a display device that can be curved with a certain curvature may be provided.

Further scope of applicability of the present disclosure will become apparent from the following detailed description. However, it should be understood that the detailed description and specific embodiments such as preferred embodiments of the present disclosure are given by way of example only, since various changes and modifications within the spirit and scope of the present disclosure may be clearly understood by those skilled in the art.

MODE FOR INVENTION

Figure 1:
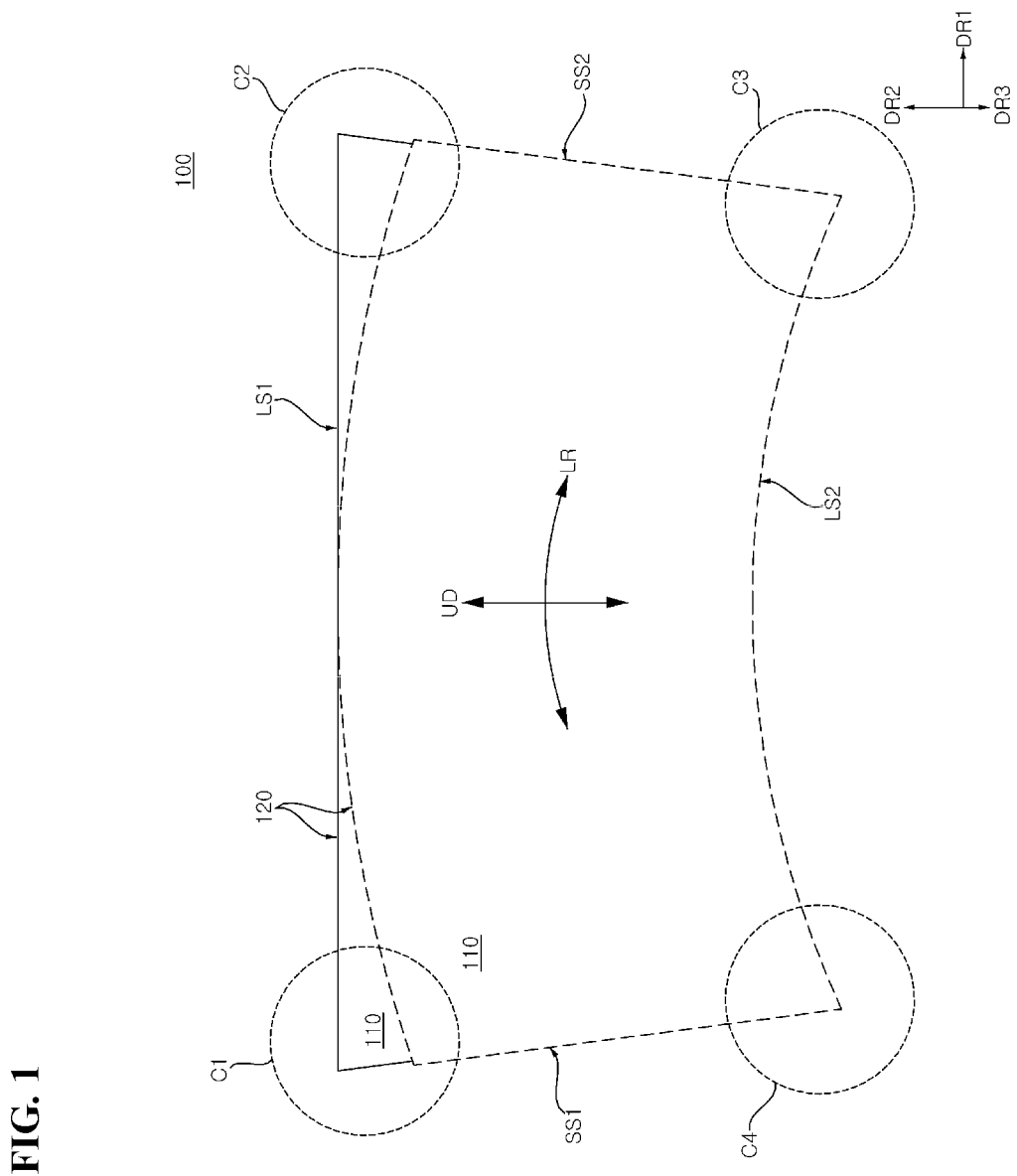
FIGS. 1 to 24 are diagrams illustrating examples of a display device according to embodiments of the present disclosure.

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function. In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the present application, it should be understood that the terms "comprises, includes," "has," etc. specify the presence of features, numbers, steps, operations, elements, components, or combinations thereof described in the specification, but do not preclude the presence or addition of one or more other features, numbers, steps, operations, elements, components, or combinations thereof Hereinafter, an Organic Light Emitting Diode (OLED) will be described as an example for a display panel, but the display panel applicable to the present disclosure is not limited to an OLED panel.

Further, hereinafter, a display device may include a first long side LS1, a second long side LS2 facing the first long side LS1, a first short side SS1 adjacent to one end of the first long side LS1 and the second long side LS2, and a second short side SS2 facing the first short side SS1. Here, the first short side area SS1 may be referred to as a first side area, the second short side area SS2 may be referred to as a second side area facing the first side area, the first long side area LS1 may be referred to as a third side area which is adjacent to the first side area and the second side area and located between the first side area and the second side area, and the second long side area LS2 may be referred to as a fourth side area which is adjacent to the first side area and the second side area, located between the first side area and the second side area, and faces the third side area.

In addition, for convenience of explanation, it is illustrated that the lengths of the first and second long sides LS1 and LS2 are longer than the lengths of the first and second short sides SS1 and SS2, but it may be possible that the lengths of the first and second long sides LS1 and LS2 are approximately the same as the lengths of the first and second short sides SS1 and SS2.

In addition, hereinafter, a first direction DR1 may be a direction parallel to the long side LS1, LS2 of a display device, and a second direction DR2 may be a direction parallel to the short side SS1, SS2 of the display device. A third direction DR3 may be a direction orthogonal to the first direction DR1 and/or the second direction DR2.

The first direction DR1 and the second direction DR2 may be collectively referred to as a horizontal direction. In addition, the third direction DR3 may be referred to as a vertical direction.

A side on which a display device displays an image may be referred to as a front or a front surface. When a display device displays an image, the side from which an image cannot be observed may be referred to as a rear or a rear surface. When the display is viewed from the front or the front side, the side of the first long side LS1 may be referred to as an upper side or an upper surface. Similarly, the side of the second long side LS2 may be referred to as a lower side or a lower surface. Similarly, the side of the first short side SS1 may be referred to as a left side or a left surface, and the side of the second short side SS2 may be referred to as a right side or a right surface.

In addition, the first long side LS1, the second long side LS2, the first short side SS1, and the second short side SS2 may be referred to as an edge of the display device 1. In addition, a point where the first long side LS1, the second long side LS2, the first short side SS1, and the second short side SS2 meet each other may be referred to as a corner. For example, a point where the first short side SS1 and the first long side LS1 meet may be referred to as a first corner C1. A point where the first long side LS1 and the second short side SS2 meet may be referred to as a second corner C2. A point where the second short side SS2 and the second long side LS2 meet may be referred to as a third corner C3. A point where the second long side LS2 and the first short side SS1 meet may be referred to as a fourth corner C4.

Here, a direction from the first short side SS1 toward the second short side SS2 or a direction from the second short side SS2 toward the first short side SS1 may be referred to as a left-right direction LR. A direction from the first long side LS1 toward the second long side LS2 or a direction from the second long side LS2 toward the first long side LS1 may be referred to as a up-down direction UD.

Referring to FIG. 1, the plate 120 may be flexible. For example, the plate 120 may be a metal plate. The plate 120 may be referred to as a flexible plate 120, a frame 120, a module cover 120, or a rear plate 120. The display panel 110 may be located in the front or in the front surface of the plate 120. The display panel 110 may be flexible. For example, the display panel 110 may be an OLED panel.

The display panel 110 may be provided on the front surface of the display device 100 and may display an image. The display panel 110 may divide an image into a plurality of pixels and output an image by adjusting color, brightness, and saturation for each pixel. The display panel 110 may generate light corresponding to a color of red, green, or blue according to a control signal.

The display device 100 may have a variable curvature. The left and right sides of the display device 100 may move to a front. For example, in a state of watching an image from the front of the display device 100, the display device 100 may be curved concavely. At this time, the plate 120 may be bent with the same curvature as the display panel 110. Alternatively, the display panel 110 may be bent in correspondence with to the curvature of the plate 120.

Figure 2:
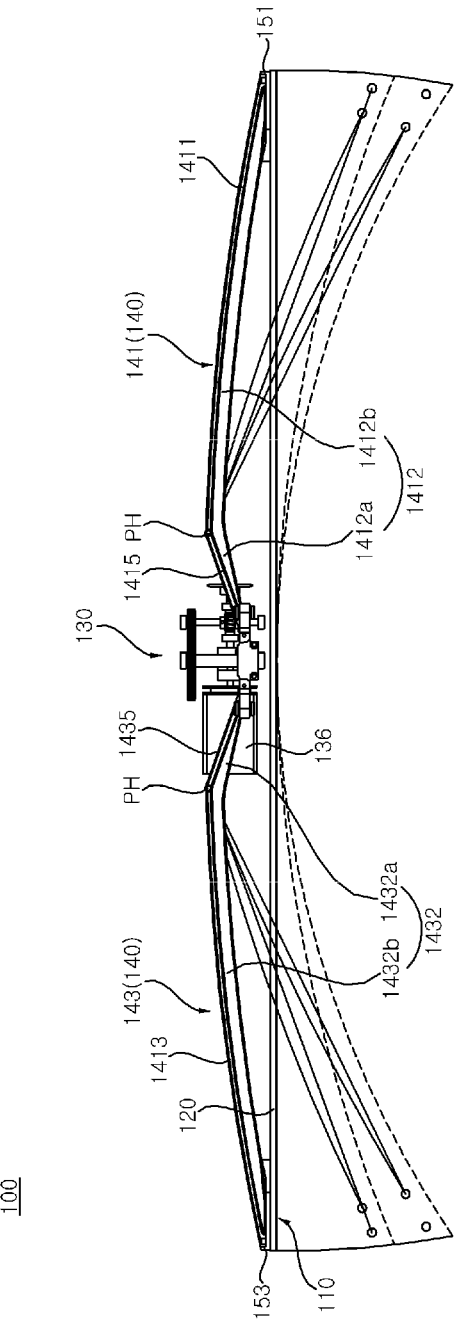
Figure 3:
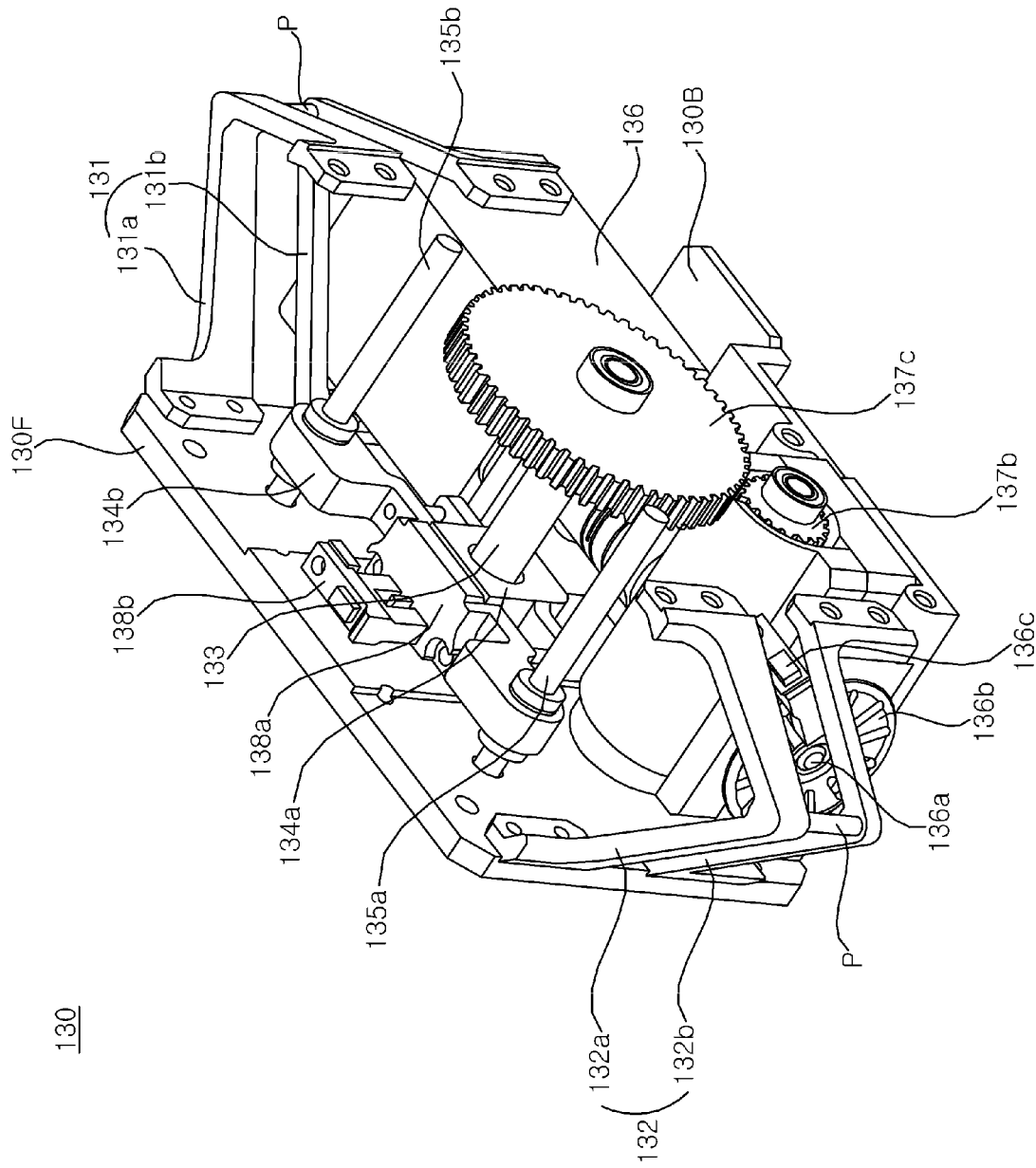

Referring to FIGS. 2 and 3, the plate 120 may be coupled to the rear of the display panel 110. The plate 120 may support the rear of the display panel 110. The plate 120 may have a shape corresponding to the display panel 110.

A driving module 130 may be coupled to the rear of the plate 120. The driving module 130 may include a front bracket 130F, a base 130B, and wing brackets 131 and 132. The front bracket 130F may be coupled to or fixed to the rear or rear surface of the plate 120. The front bracket 130F may have a rectangular flat plate shape. The base 130B may be coupled to or fixed to the front bracket 130F and may form the bottom of the driving module 130.

There may be a plurality of wing brackets 131 and 132. The plurality of wing brackets 131 and 132 may include a first wing bracket 131 and a second wing bracket 132. The first wing bracket 131 may be coupled or fixed to the front bracket 130F and face the second wing bracket 132. The second wing bracket 132 may also be coupled or fixed to the front bracket 130F.

The wing bracket 131, 132 may have a V-shape. The wing bracket 131, 132 may be a pair of brackets 131 and 132. In the wing bracket 131, 132, the upper bracket 131a, 132a and the lower bracket 131b, 132b may be located side by side. A pin P may be located between the upper bracket 131a, 132a and the lower bracket 131b, 132b. Vertices of the upper bracket 131a, 132a and the lower bracket 131b, 132b may be connected.

A first wing 143 may be rotatably coupled to the first wing bracket 131, and a second wing 141 may be rotatably coupled to the second wing bracket 132. The first wing 143 may be line symmetrical with the second wing 141 with respect to the driving unit 130.

Figure 4:
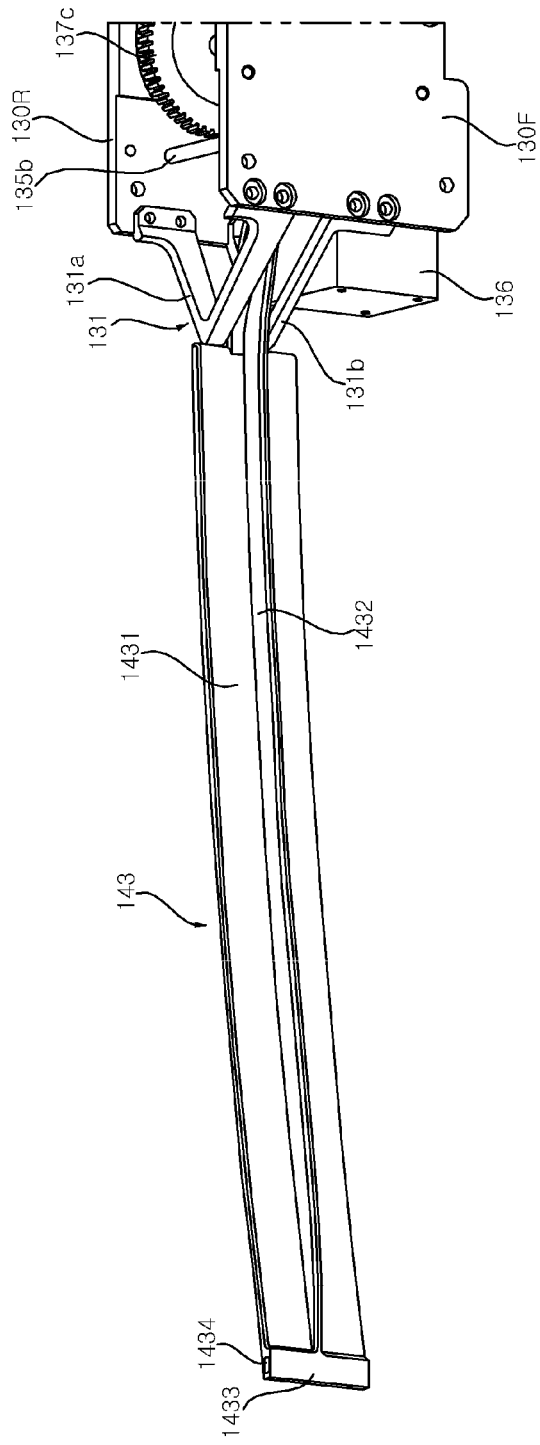
Figure 5:
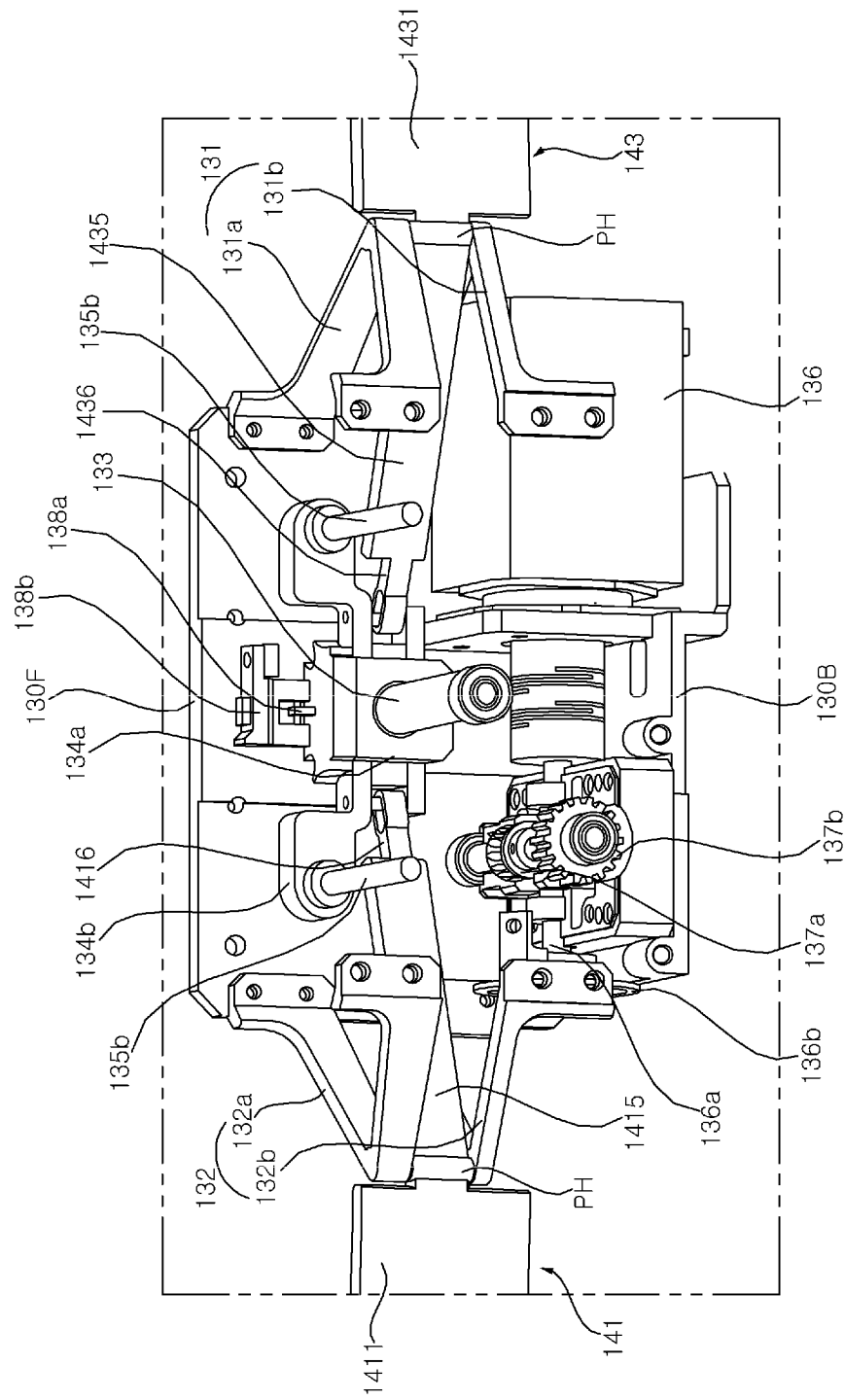

Referring to FIGS. 4 and 5, the first wing 143 may be pivotally connected to the first wing bracket 131. A description of the first wing 143 and the first wing bracket 131 may be applied to the second wing 141 and the second wing bracket 132. The first wing 143 may include a wing plate 1431, a rib 1432, a wing end 1433, a pivot shaft PH, and a lever 1435.

The wing plate 1431 may be an elongated plate. The lever 1435 may extend from one end of the wing plate 1431. The lever 1435 may be an elongated plate. The length of the lever 1435 may be shorter than the length of the wing plate 1431, and the width of the lever 1435 may be smaller than the width of the wing plate 1431. The thickness of the wing plate 1431 may be substantially the same as the thickness of the lever 1435.

Referring to FIG. 2 together, a rib 1412, 1432 extends long in the longitudinal direction of a wing plate 1411, 1431 and a lever 1415, 1435, and may be formed on one side of the wing plate 1411, 1431 and the lever 1415, 1435. The rib 1412, 1432 may intersect the width direction of the wing plate 1411, 1431 and the lever 1415, 1435. The wing plate 1411, 1431 may be gently curved, and the lever 1415, 1435 may be connected to the wing plate 1411, 1431 while being bent. The rib 1412, 1432 may include a first rib 1412a, 1432a and a second rib 1412b, 1432b. The width of the first rib 1412a, 1432a may gradually decrease as a distance from the pivot shaft PH increases. The width of the second rib 1412b, 1432b may be substantially the same as the width of the first rib 1412a, 1432a adjacent to the pivot shaft PH.

In FIG. 5, the pivot shaft PH of the wing 141, 143 may be pivotally connected to the pin P of the wing bracket 131, 132. The pin P may be inserted into the pivot shaft PH of the wing 141, 143. The wing 141, 143 may rotate or pivot in the wing bracket 131, 132 around the pin P. The thickness of the pivot shaft PH may be greater than the thickness of the wing plate 1411, 1431 and/or the lever 1415, 1435. Accordingly, structural rigidity of the wing 140 according to driving may be improved.

Figure 6:
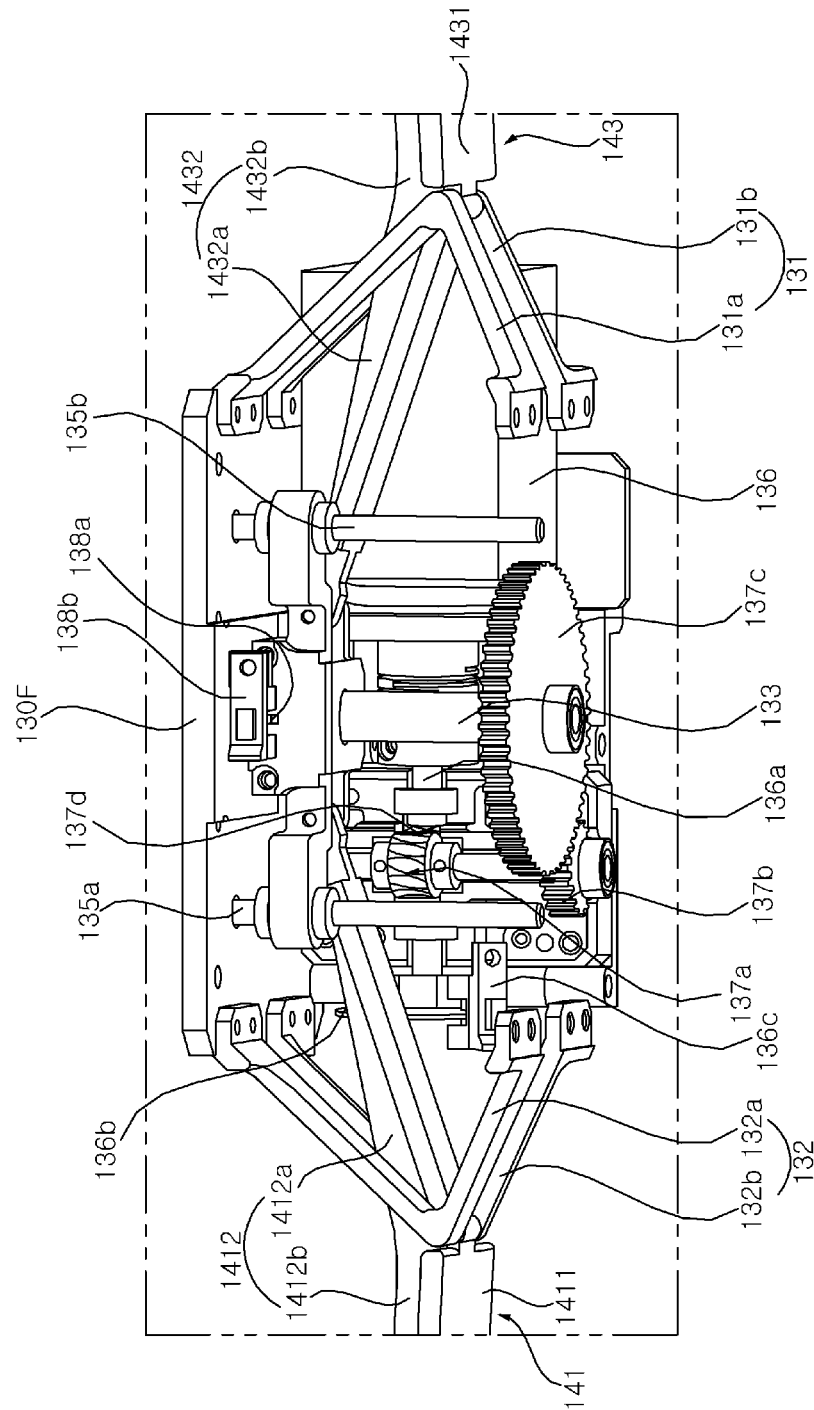

Referring to FIGS. 5 and 6, the lead screw 133 may be rotatably installed in the front bracket 130F. For example, the lead screw 133 may extend long and may have a screw thread on the outer surface. The lead screw 133 may be inserted into a slider 134a. The slider 134a may be threaded with the lead screw 133. When the lead screw 133 rotates, the slider 134a may reciprocate in the longitudinal direction of the lead screw 133.

A slider guide 134b may be fixed on the slider 134a. The slider guide 134b may move together with the slider 134a. A guide shaft 135a, 135b may be coupled or fixed to the front bracket 130F. The guide shaft 135a, 135b may be parallel to the lead screw 134b. The guide shaft 135a, 135b may include a first guide shaft 135a and a second guide shaft 135b. The first guide shaft 135a may face the second guide shaft 135b with respect to the lead screw 133. The guide shaft 135a, 135b may be inserted into the slider guide 134b. Accordingly, the slider 134a can stably reciprocate in the longitudinal direction of the lead screw 133 according to the rotation of the lead screw 133.

The motor 136 may be mounted on the base 130B. A rotation shaft 136a of the motor 136 may intersect the longitudinal direction of the lead screw 133. The motor 136 and the rotation shaft 136a of the motor 136 may be disposed between the lead screw 133 and the base 130B. A worm 137d may be fixed to the rotation shaft 136a of the motor 136, and may rotate together with the rotation shaft 136a of the motor 136. A worm gear 137a may be engaged with the worm 137d. A transmission gear 137b may rotate coaxially with the worm gear 137a. A drive gear 137c may be fixed to one end of the lead screw 133 and may rotate together with the lead screw 133. The drive gear 137c may be engaged with the transmission gear 137b. The diameter of the drive gear 137c may be greater than the diameter of the transmission gear 137b.

A disk indicator 136b may be adjacent and fixed to a distal end of the rotation shaft 136a of the motor 136. A sensor 136c may be fixed to the base 130B or the wing bracket 132 while being adjacent to the disk indicator 136b. Accordingly, the rotation number and/or rotation amount of the motor 136 may be detected. A pin indicator 138a may be fixed on the slider 134a or the slider guide 134b. The sensor 138b may be fixed to the front bracket 130F and may detect the approach of the pin indicator 138a. Accordingly, a start point and/or a terminal point of the slider 134a may be detected.

Figure 7:
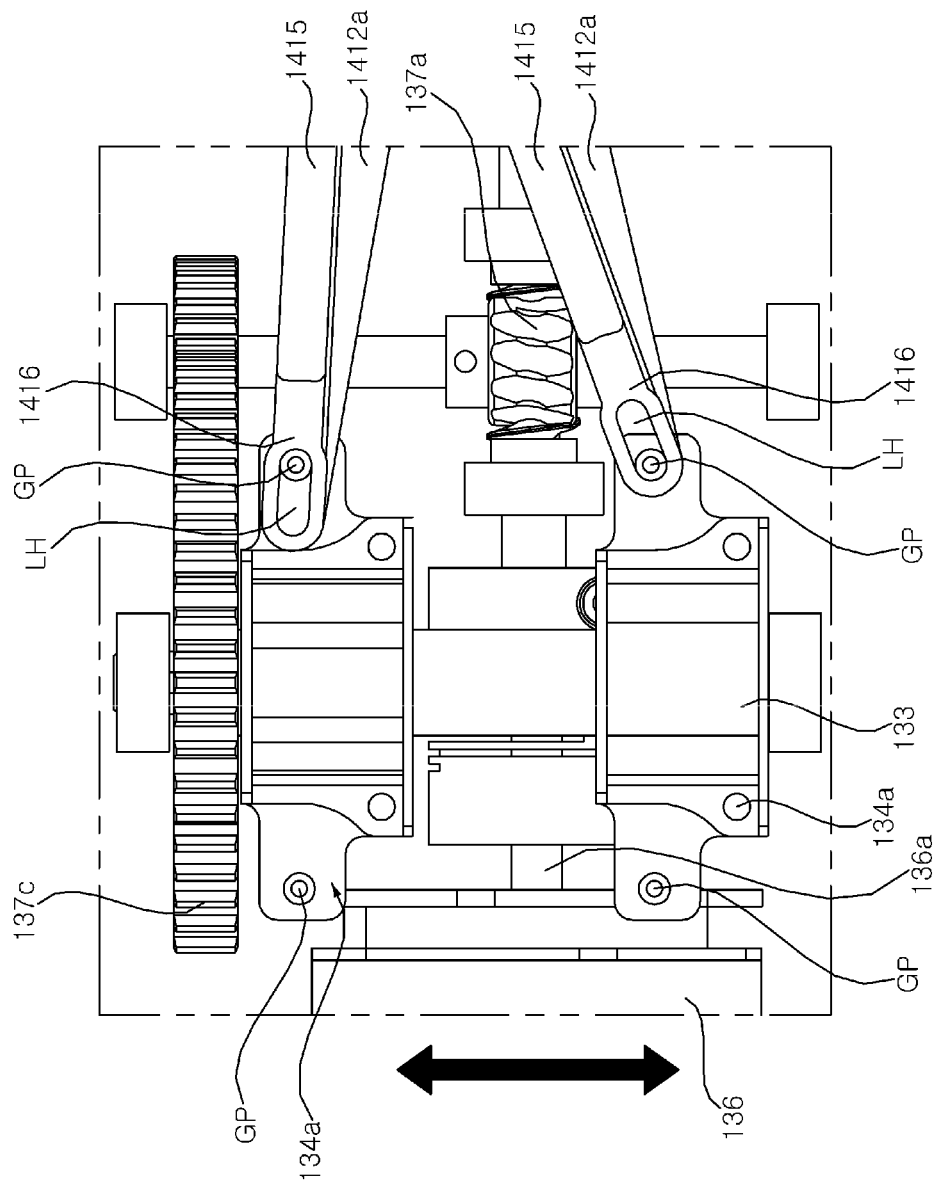
Figure 8:
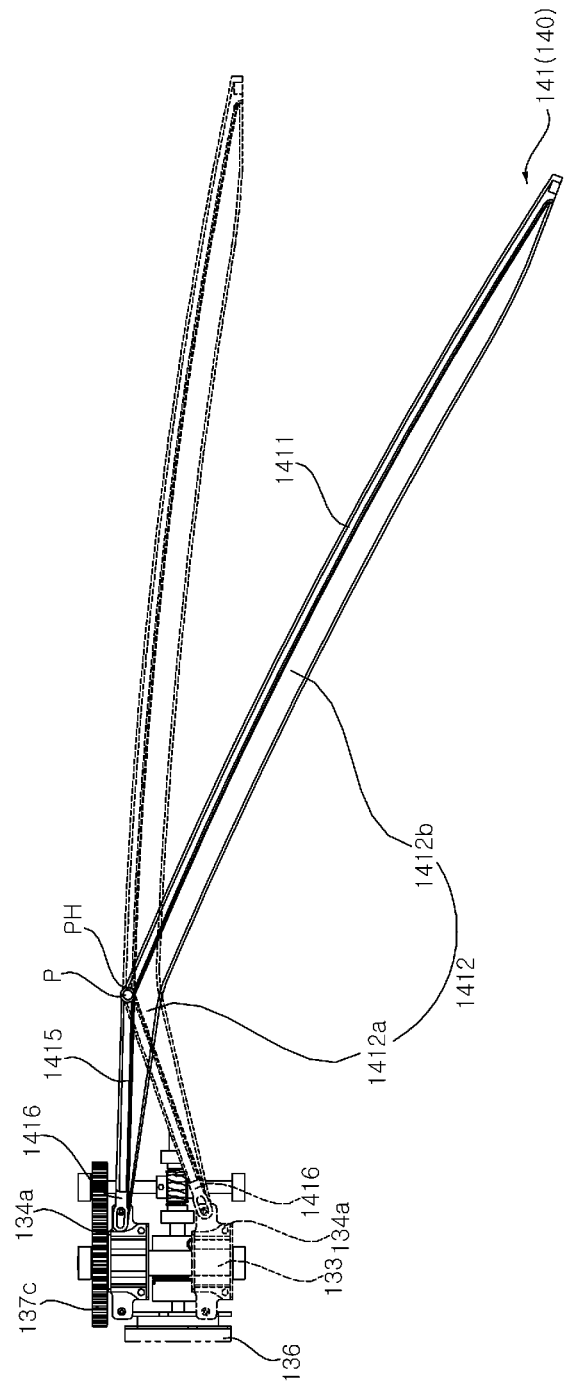

Referring to FIGS. 7 and 8, the wing 141 may include a connecting rod 1416. The connecting rod 1416 may be fixed to or extend from lever 1415. The connecting rod 1416 may be connected to the slider 134a. The connecting rod 1416 may be pivotally connected to the slider 134a. The connecting rod 1416 may have a long hole LH. The long hole LH may be formed in a distal end of the connecting rod 1416 adjacent to the slider 134a. The slider 134a may include a connection pin GP. The connection pin GP may have a cylindrical shape. The diameter of the connection pin GP may be substantially the same as the width of the long hole LH.

As the lead screw 133 rotates, the slider 134a may reciprocate in the longitudinal direction of the lead screw 133. The lever 1415 connected to the slider 134a by the connecting rod 1416 may move together with the slider 134a, and the wing 141 may pivot around the pivot shaft PH. At this time, the connection pin GP may move in the long hole LH.

Figure 9:
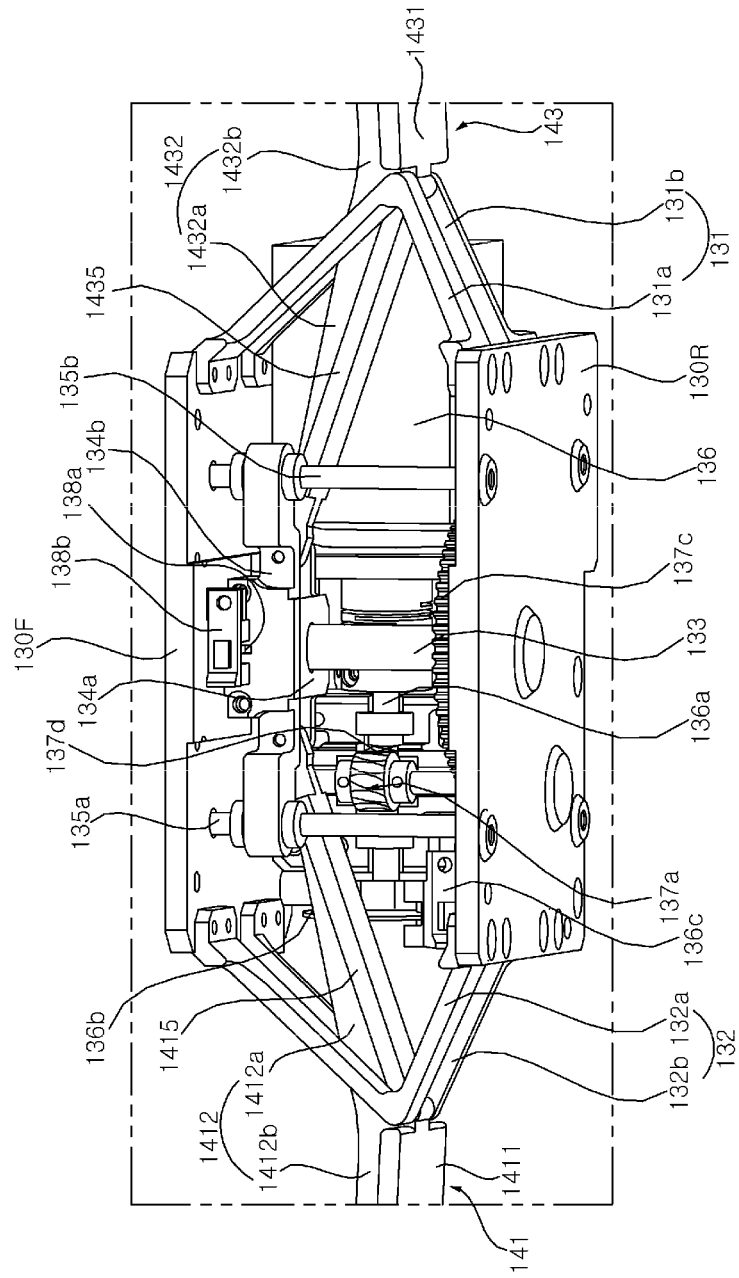

Referring to FIG. 9, a rear bracket 130R may be coupled to the wing brackets 131 and 132. The rear bracket 130R may face the front bracket 130F. The lead screw 133 may connect the front bracket 130F and the rear bracket 130R.

The guide shaft 135a, 135b may be coupled to the front bracket 130F and the rear bracket 130R. The length of the lead screw 133 and/or the length of the guide shaft 135a, 135b may correspond to the distance between the front bracket 130F and the rear bracket 130R.

The wing brackets 131 and 132 may be coupled to the front bracket 130F and the rear bracket 130R. One end of the wing bracket 131, 132 may be coupled or fixed to the front bracket 130F, and the other end of the wing bracket 131, 132 may be coupled or fixed to the rear bracket 130R.

Figure 10:
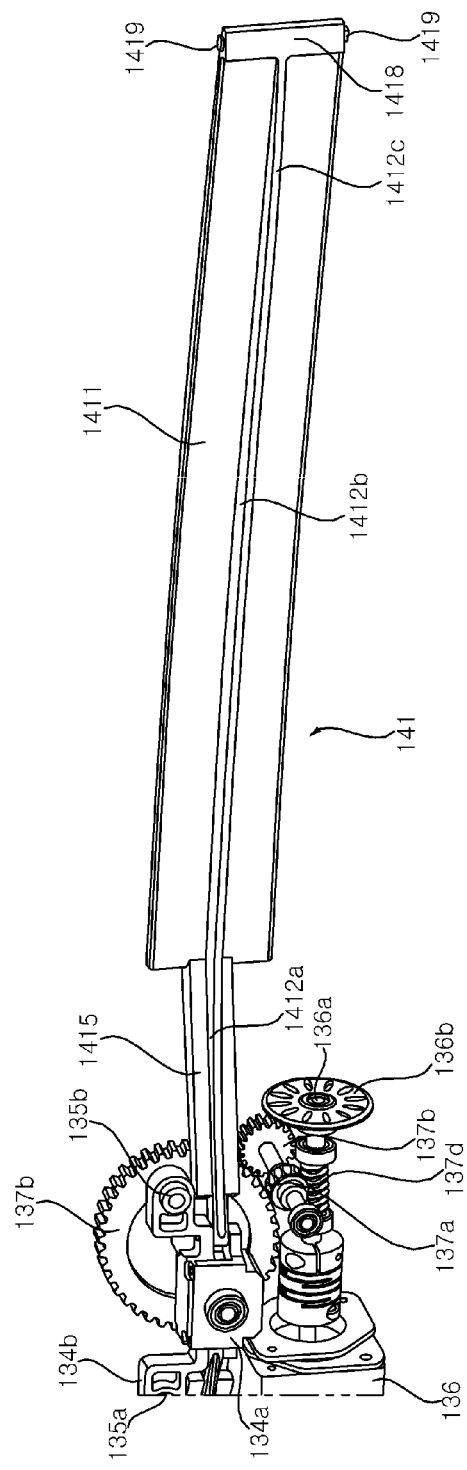
Figure 11:
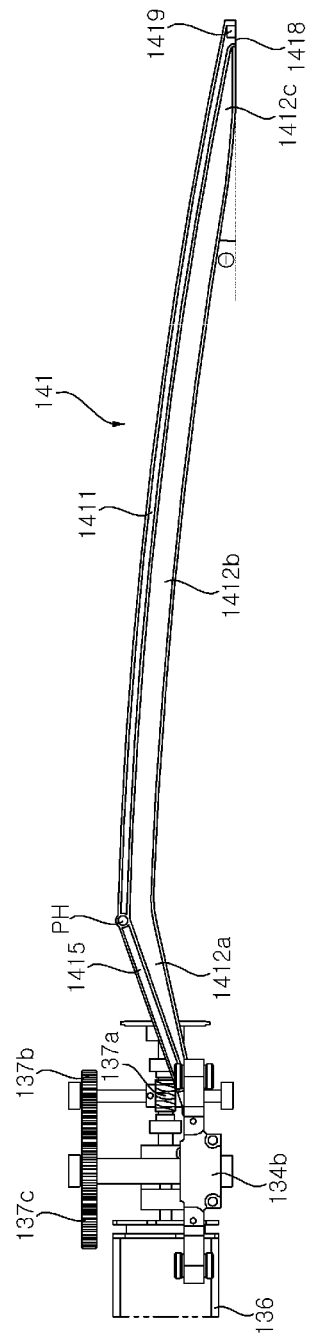

Referring to FIGS. 10 and 11, the wing 141 may include a wing end 1418 and an end rib 1412c. The wing end 1418 may form a distal end of wing plate 1411. The thickness of the wing end 1418 may be greater than the thickness of the wing plate 1411.

The end rib 1412c may be referred to as a third rib 1412c. The third rib 1412c may connect the wing end 1418 from the second rib 1412b. The third rib 1412c may extend in the longitudinal direction of the second rib 1412b and may be formed in the wing plate 1411.

The longitudinal direction of the third rib 1412c may form a certain angle with respect to the longitudinal direction of the second rib 1412b. For example, the longitudinal direction of the second rib 1412b may form an obtuse angle with respect to the longitudinal direction of the third rib 1412c.

An end pin 1419 may be formed in the wing end 1418. The end pin 1419 may protrude from one side and/or the other side of the wing end 1418.

Figure 12:
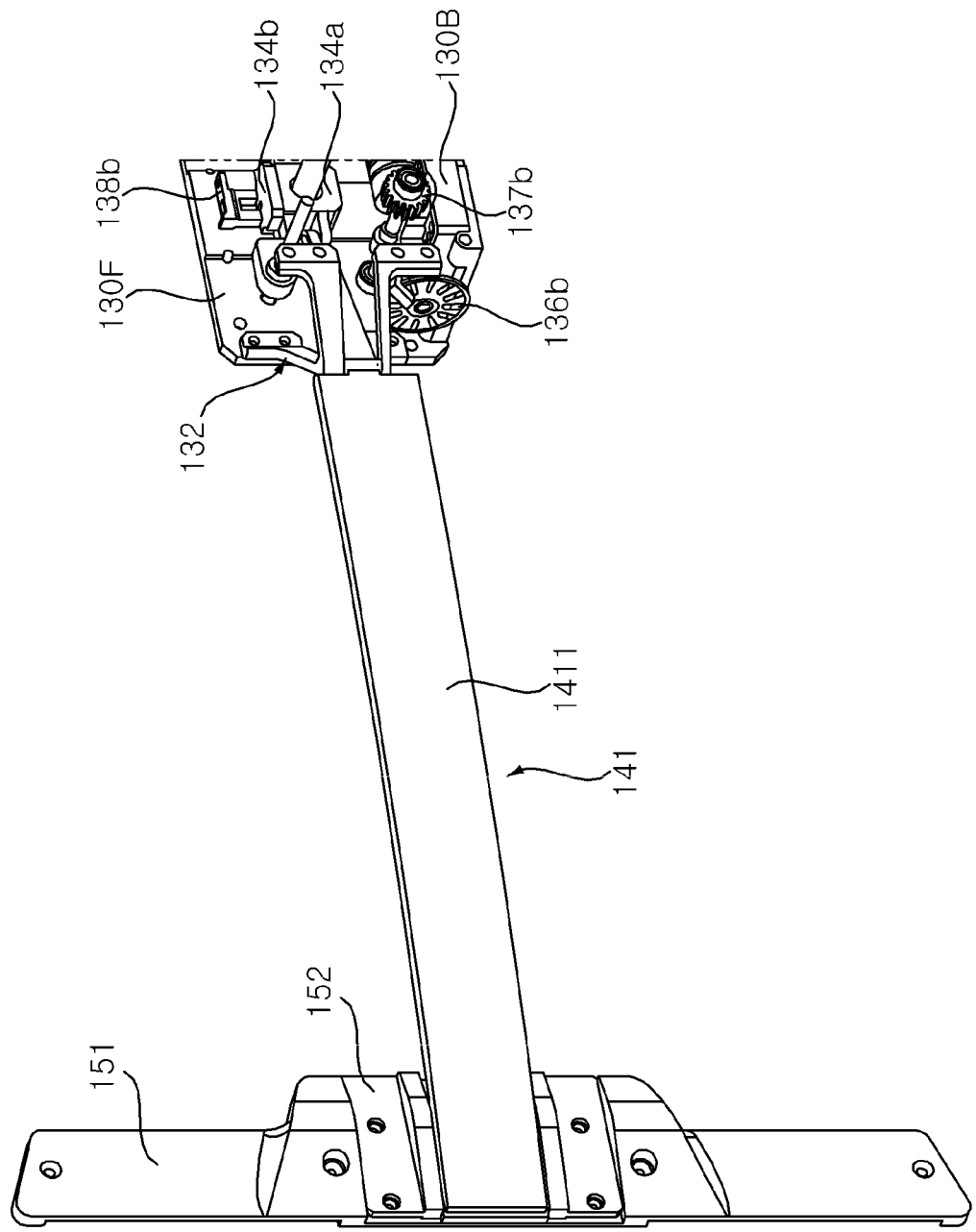
Figure 13:
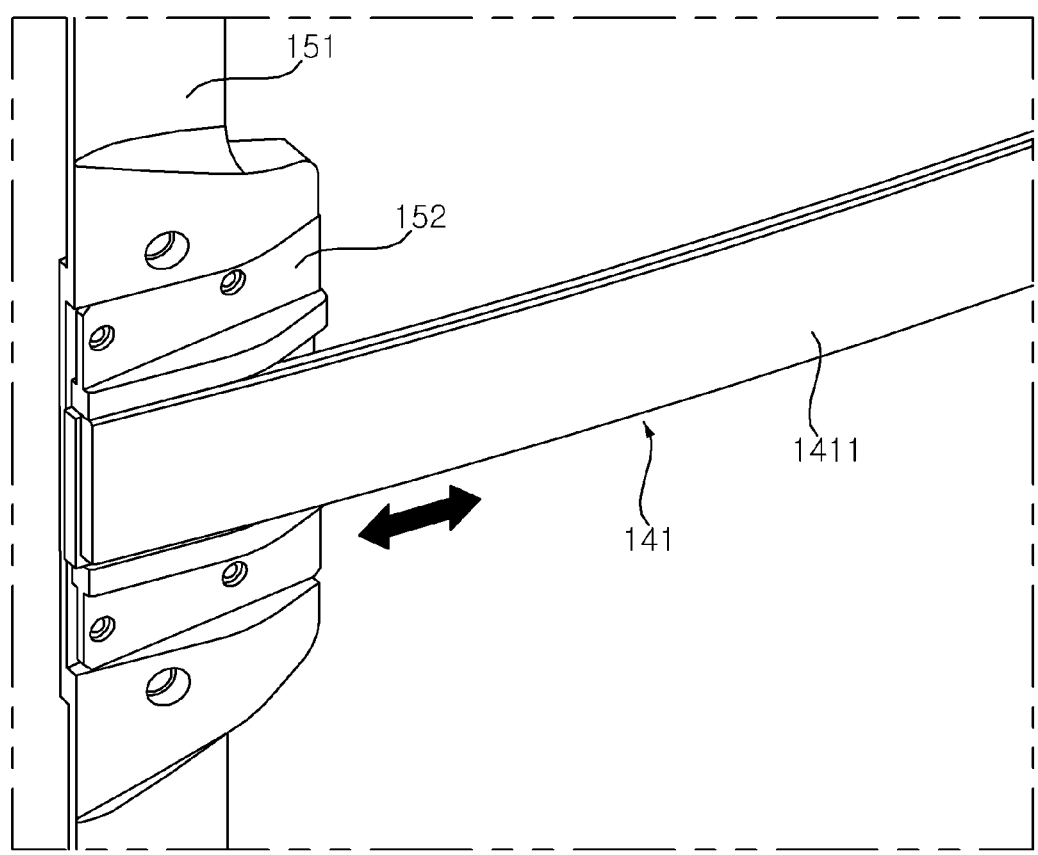
Figure 14:
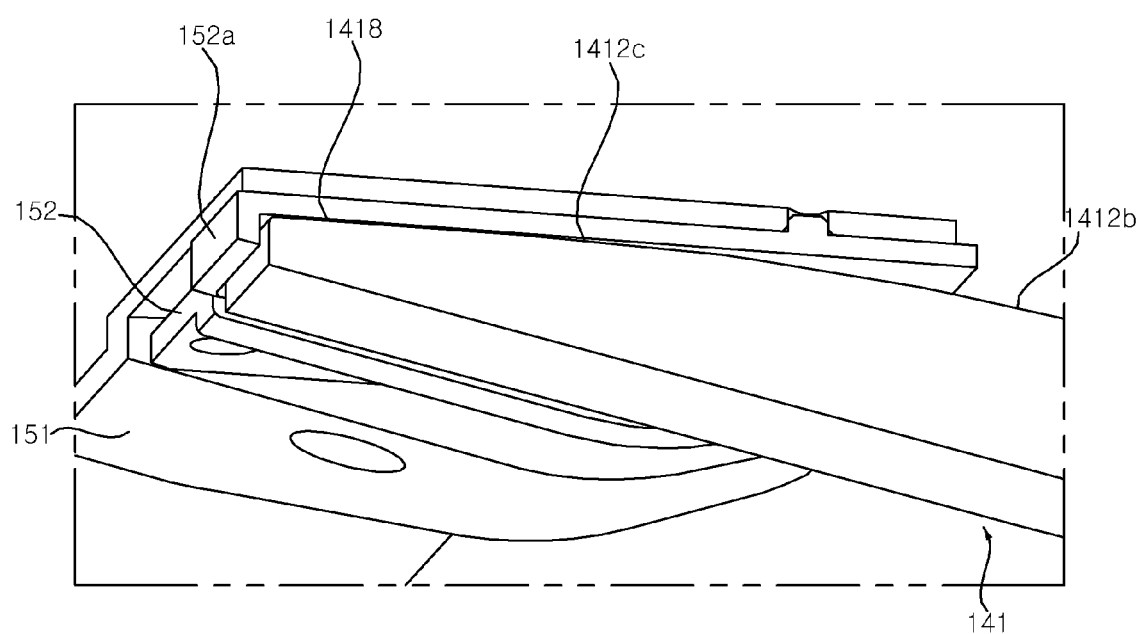

Referring to FIGS. 12 to 14, the side frame 151, 153 (see FIG. 2) may be coupled or fixed to the rear or rear surface of the plate 120. The side frame 151 may include a sliding mount 152. The sliding mount 152 may be mounted or fixed on the side frame 151.

The wing 141 may be coupled to the sliding mount 152 to be movable in the sliding mount 152. As the wing 141 moves in the sliding mount 152, the third rib 1412c and the wing end 1418 may be in contact with the sliding mount 152. While the third rib 1412c and the wing end 1418 come into contact with the sliding mount 152 each other, the force of the wing 141 bending the plate 120 may be effectively transmitted.

The sliding mount 152 may include a stopper 152a formed by bending a distal end. When the plate 120 is held flat, the wing end 1418 may be in contact with the stopper 152a of the sliding mount 152. Accordingly, both ends of the plate 120 may be directed toward the rear of the display device 100 to prevent the front surface of the display panel 110 from being convexly curved.

Figure 15:
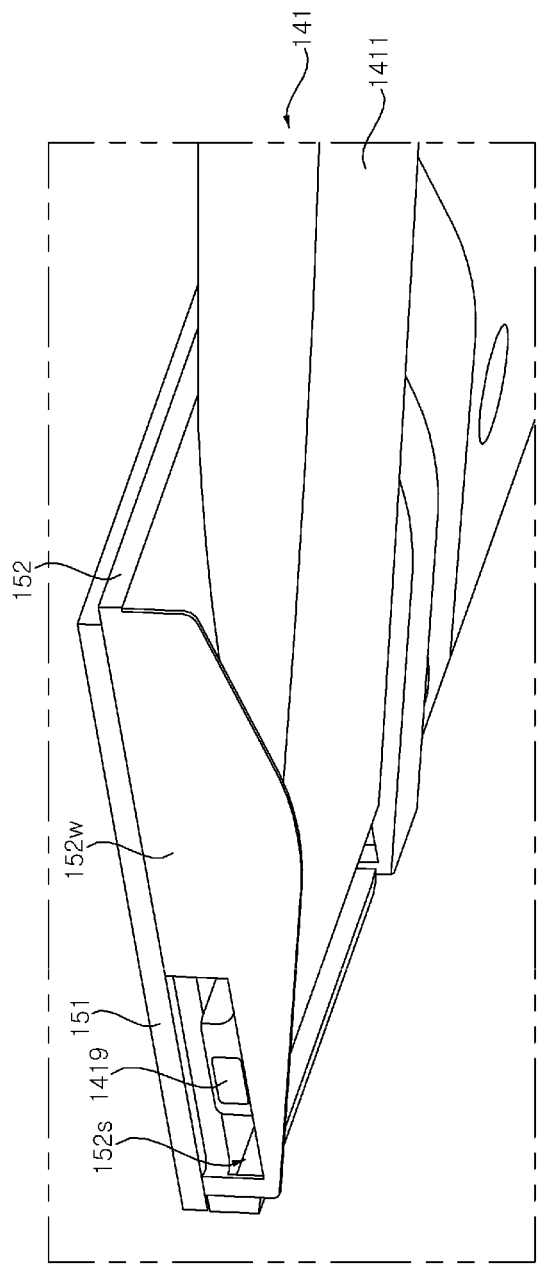
Figure 16:
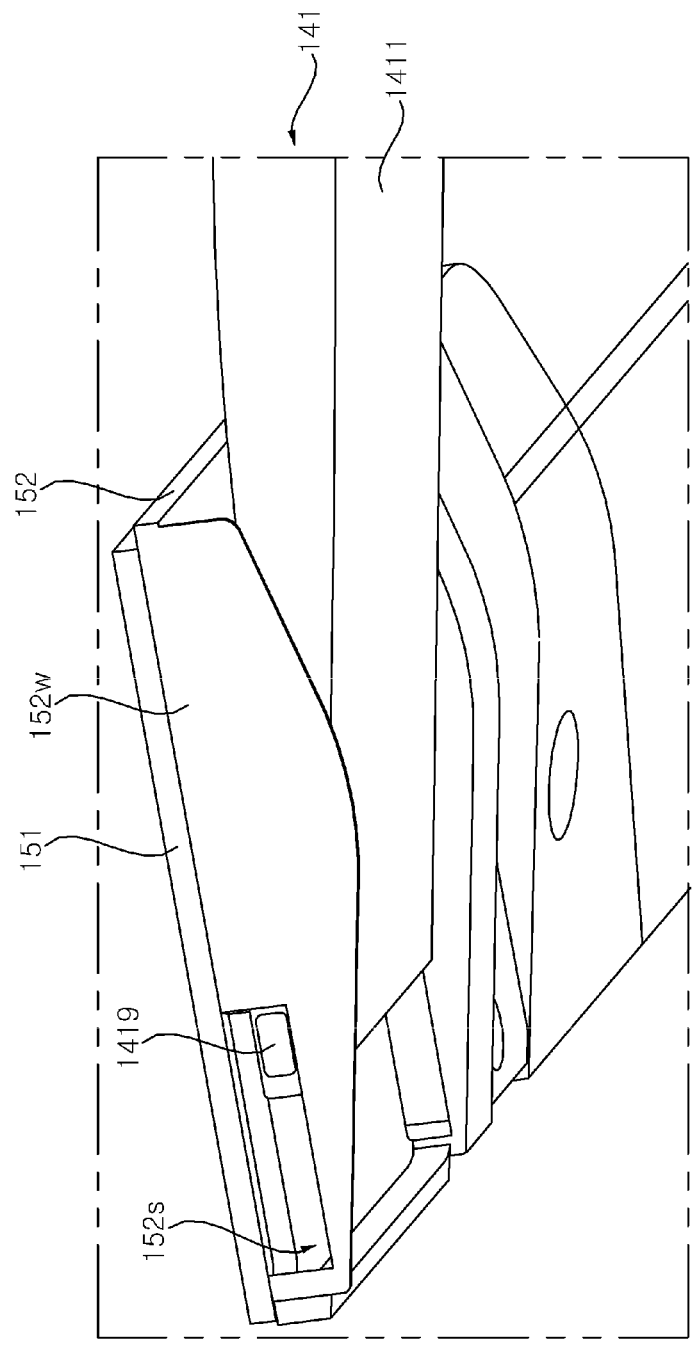

Referring to FIGS. 15 and 16, the sliding mount 152 may include a side wall 152W. The side wall 152W may face the side surface of the wing plate 1411. The wing plate 1411 may contact the side wall 152W while moving on the sliding mount 152. The side wall 152W may guide the movement of the wing plate 1411.

The guide slot 152S may be formed in the side wall 152W. The guide slot 152S may be formed long by penetrating the side wall 152W in the longitudinal direction of the wing plate 1411. For example, the guide slot 152S may be rectangular.

The end pin 1419 may be inserted into the guide slot 152S. The end pin 1419 may be movable in the guide slot 152S. The end pin 1419 may restrict the movement of the wing plate 1411 together with the guide slot 152S. For example, end pin 1419 may have a rectangular cross section.

Accordingly, the force transmitted from the wing plate 1411 to the side frame 151 may be maintained constant. In addition, as the display panel 110 and the plate 120 are curved, flattening of area adjacent to both ends of the display panel 110 and the plate 120 may be improved.

Figure 17:
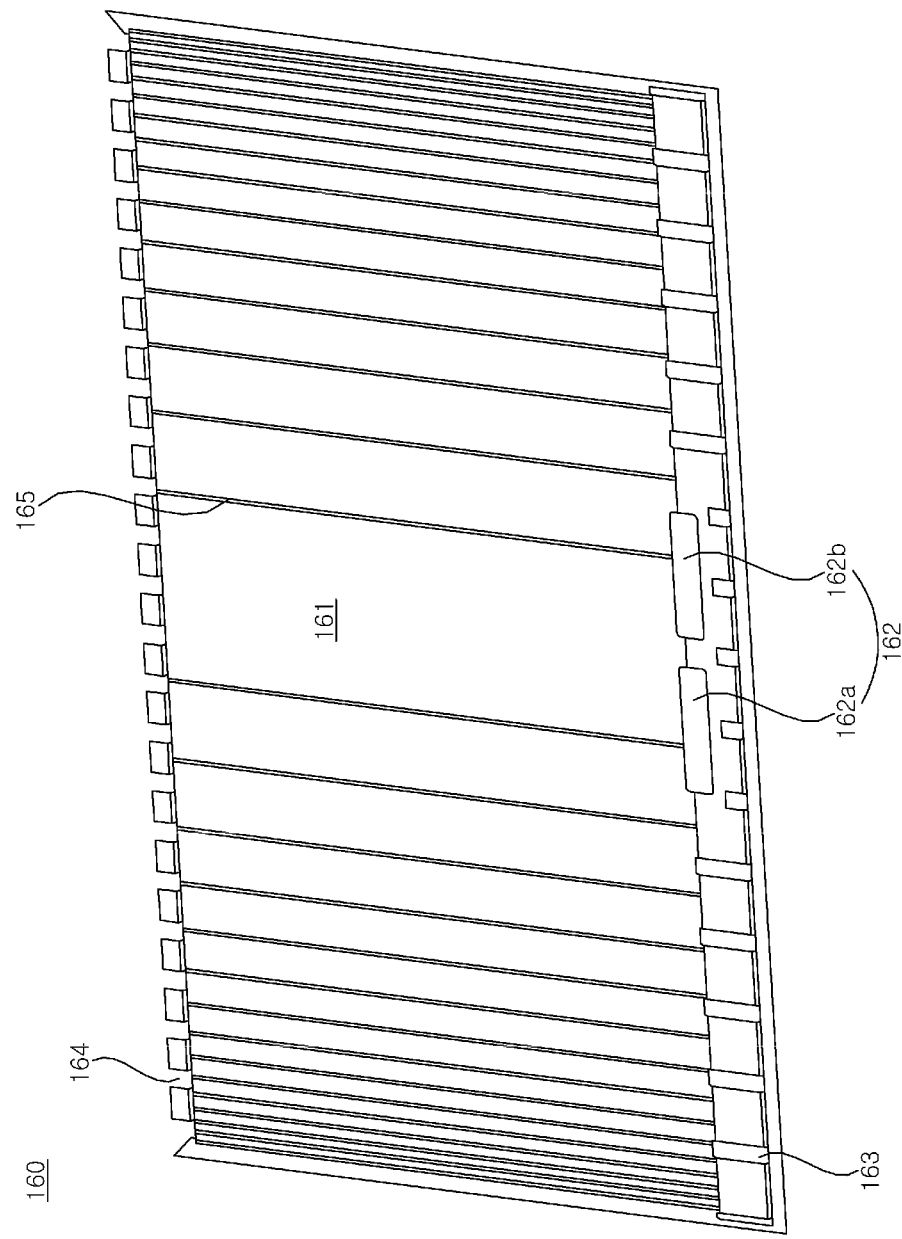
Figure 18:
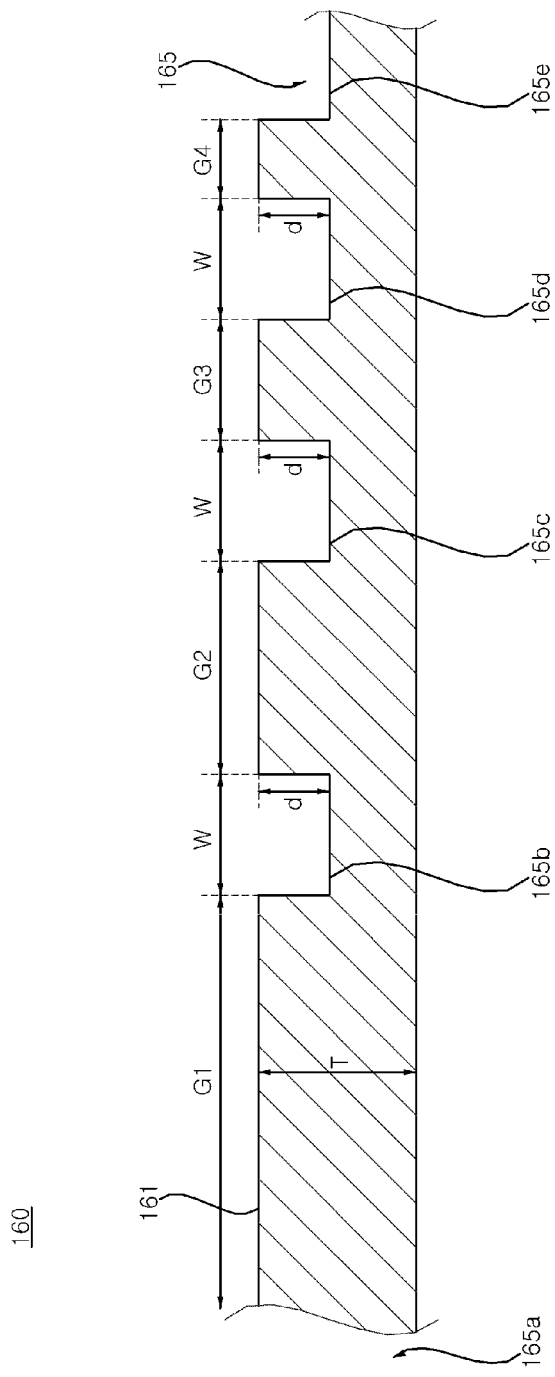

Referring to FIGS. 17 and 18, an inner plate 160 may be located between the display panel 110 (see FIG. 2) and the plate 120. A cutting line 165 may be formed on the front surface of a flat plate portion 161 of the inner plate 160. For example, the cutting line 165 may form a rectangular cross-section in the left-right direction of the inner plate 160.

The cutting line 165 may be formed by etching or cutting out the front surface of the flat plate portion 161 of the inner plate 160 in the up-down direction of the inner plate 160. For example, the thickness T of the flat plate portion 161 of the inner plate 160 may be about 1.3 to 1.7 times the depth d of the cutting line 165.

A plurality of cutting lines 165 may be formed long in the up-down direction of the inner plate 160. The plurality of cutting lines 165 may have the same width W. Each of the plurality of cutting lines 165 may be disposed at different gaps from neighboring cutting lines 165. A first gap G1 between a first cutting line 165a closest to the center of the inner plate 160 and a second cutting line 165b adjacent to the first cutting line 165a may be greater than a second gap G2 between the second cutting line 165b and a third cutting line 165c adjacent to the second cutting line 165b. A third gap G3 between the third cutting line 165c and a fourth cutting line 165d adjacent to the third cutting line 165c may be greater than a fourth gap G4 between the fourth cutting line 165d and a fifth cutting line 165e adjacent to the fourth cutting line 165d. The second gap G2 may be greater than the third gap G3. The gap between the plurality of cutting lines 165 may gradually decrease from the center of the inner plate 160 toward the side. Accordingly, while the display device is curved, curvature matching may be improved. For example, the curvature may be 800R or 1000R.

A cable hole 162 may penetrate the flat plate portion 161 of the inner plate 160 and be formed on the flat plate portion 161 of the inner plate 160. The cable hole 162 may extend long in the left-right direction. The cable hole 162 may be formed adjacent to a lower side of the inner plate 160. The plurality of cable holes 162 may be adjacent to the center of the inner plate 160 and located adjacent to each other.

A plurality of accommodating holes 163 may be formed by penetrating the inner plate 160 along the lower side of the inner plate 160. For example, the source PCB of the display panel 110 may be received and located in the accommodating hole 163.

A cutout 164 may be formed in the upper side of the flat plate portion 161 of the inner plate 160. There may be a plurality of cutouts 164, and the plurality of cutouts 164 may be formed while being spaced apart at regular intervals along the upper side of the flat plate portion 161 of the inner plate 160.

Figure 19:
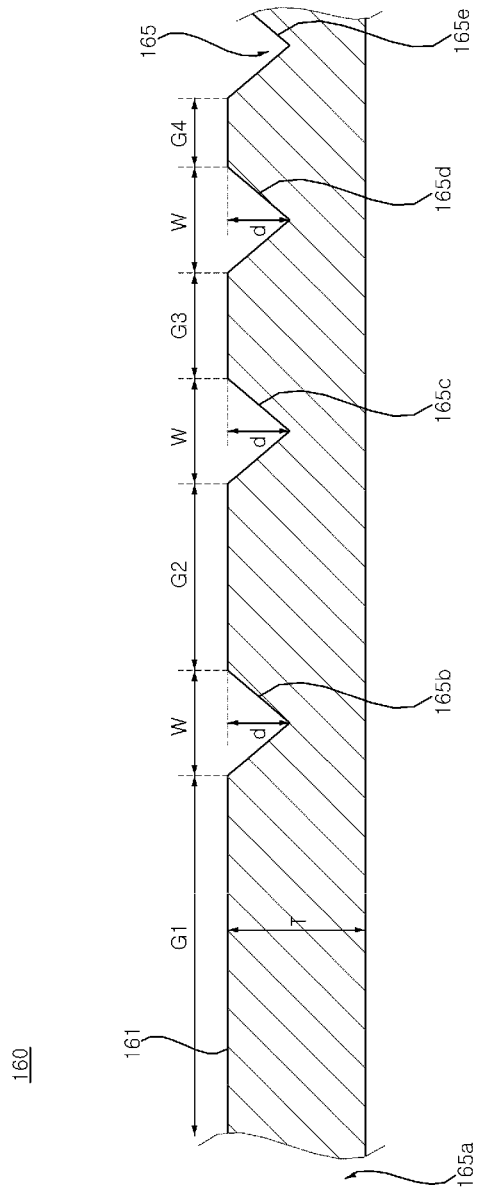

Referring to FIG. 19, the cutting line 165 may be formed on the front surface of the flat plate portion 161 of the inner plate 160. For example, the cutting line 165 may form a triangular cross section in the left-right direction of the inner plate 160.

The cutting line 165 may be formed by etching or cutting out the front surface of the flat plate portion 161 of the inner plate 160 in the up-down direction of the inner plate 160. For example, the thickness T of the flat plate portion 161 of the inner plate 160 may be about 1.3 to 1.7 times the depth d of the cutting line 165.

A plurality of cutting lines 165 may be formed long in the vertical direction of the inner plate 160. The plurality of cutting lines 165 may have the same width W as each other. Each of the plurality of cutting lines 165 may be disposed at different gaps from neighboring cutting lines 165. The first gap G1 between the first cutting line 165a closest to the center of the inner plate 160 and the second cutting line 165b adjacent thereto may be greater than the second gap G2 between the second cutting line 165b and the third cutting line 165c adjacent thereto. The third gap G3 between the third cutting line 165c and the fourth cutting line 165d adjacent thereto may be greater than the fourth gap G4 between the fourth cutting line 165d and the fifth cutting line 165e adjacent thereto. The second gap G2 may be greater than the third gap G3. The gap between the plurality of cutting lines 165 may gradually decrease from the center of the inner plate 160 toward the side.

Accordingly, while the display device is curved, curvature matching may be improved. For example, the curvature may be 800R or 1000R.

Figure 20:
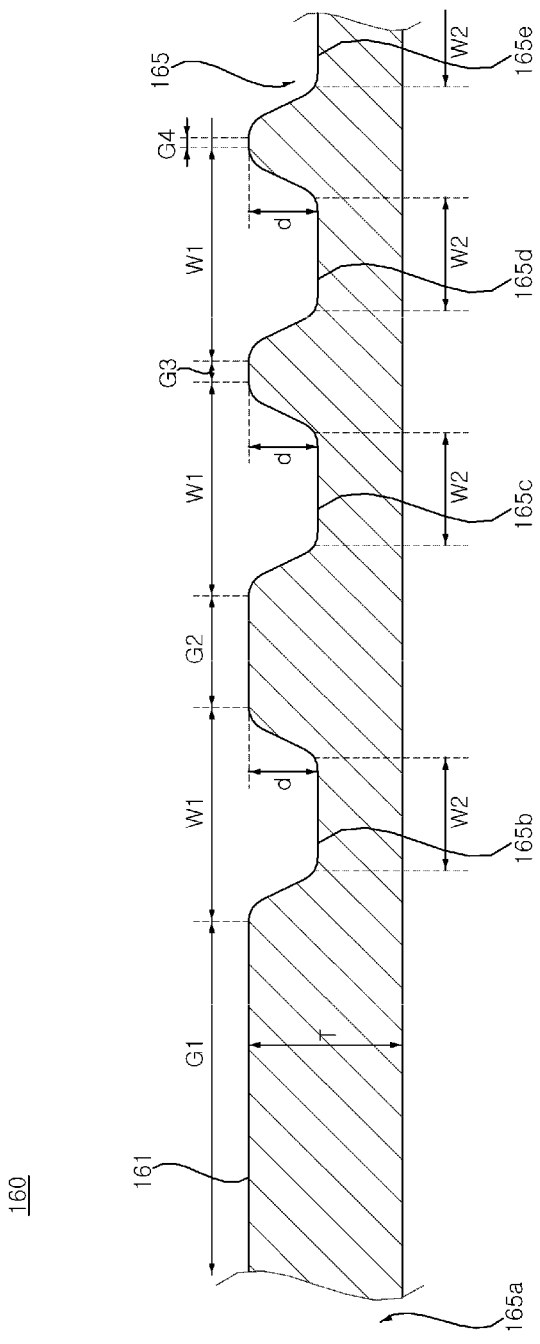

Referring to FIG. 20, the cutting line 165 may be formed on the front surface of the flat plate portion 161 of the inner plate 160. For example, the cutting line 165 may form a trapezoidal cross section in the left-right direction of the inner plate 160.

The cutting line 165 may be formed by etching or cutting out the front surface of the flat plate portion 161 of the inner plate 160 in the up-down direction of the inner plate 160. For example, the thickness T of the flat plate portion 161 of the inner plate 160 may be about 1.3 to 1.7 times the depth d of the cutting line 165.

A plurality of cutting lines 165 may be formed long in the up-down direction of the inner plate 160. The plurality of cutting lines 165 may have the same width W1, W2. A first width W1 of the upper end of the cutting line 165 may be greater than a second width W2 of the bottom of the cutting line 165. The edge of the upper end of the cutting line 165 may be rounded, and the edge of the bottom of the cutting line 165 may be rounded. The edge of the upper end of the cutting line 165 may be an embossed edge, and the edge of the bottom of the cutting line 165 may be an intaglio edge.

Each of the plurality of cutting lines 165 may be disposed at different gaps from neighboring cutting lines 165. The first gap G1 between the first cutting line 165a closest to the center of the inner plate 160 and the second cutting line 165b adjacent thereto may be greater than the second gap G2 between the second cutting line 165b and the third cutting line 165c adjacent thereto. The third gap G3 between the third cutting line 165c and the fourth cutting line 165d adjacent thereto may be greater than the fourth gap G4 between the fourth cutting line 165d and the fifth cutting line 165e adjacent thereto. The second gap G2 may be greater than the third gap G3. Gaps between the plurality of cutting lines 165 may gradually decrease from the center of the inner plate 160 toward the side.

Accordingly, while the display device is curved, curvature matching may be improved. For example, the curvature may be 800R or 1000R.

Figure 21:
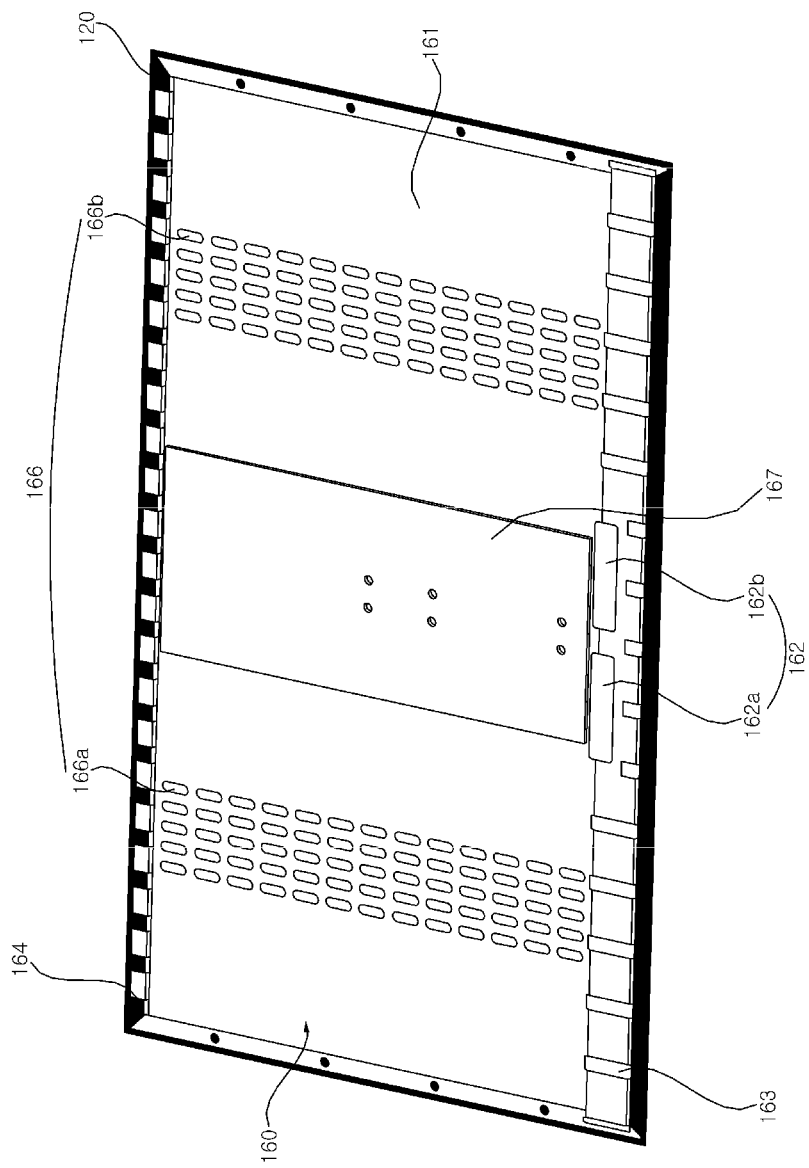

Referring to FIG. 21, the inner plate 160 may be located between the plate 120 and the display panel 110 (see FIG. 2). The inner plate 160 may be coupled to or fixed to the plate 120.

A center plate 167 may be coupled or fixed to the inner plate 160. The center plate 167 may be a plate extends long in the up-down direction. The center plate 167 may reinforce the rigidity of the inner plate 160.

The cable hole 162 may penetrate the flat plate portion 161 of the inner plate 160 and be formed in the flat plate portion 161 of the inner plate 160. The cable hole 162 may extend long in the left-right direction. The cable hole 162 may be formed adjacent to the lower side of the inner plate 160. The plurality of cable holes 162 may be adjacent to the center of the inner plate 160 and located adjacent to each other.

The width of the center plate 167 may correspond to the length of the cable holes 162. A distance between both ends of the center plate 167 in the width direction may be smaller than a distance between both ends of the cable holes 162.

A plurality of accommodating holes 163 may be formed by penetrating the inner plate 160 along the lower side of the inner plate 160. For example, the source PCB of the display panel 110 may be received and located in the accommodating hole 163.

A punching hole 166 may be formed in the flat plate portion 161 of the inner plate 160. The number of punching holes 166 may be plural. The plurality of punching holes 166 may include a plurality of first punching holes 166a and a plurality of second punching holes 166b. The punching hole 166 may be a long hole extending long in the up-down direction.

The plurality of first punching holes 166a may be located between the center plate 167 and the left side of the inner plate 160. The plurality of second punching holes 166b may be located between the center plate 167 and the right side of the inner plate 160. For example, the punching holes 166 may form 5 columns. For another example, the punching holes 166 may form 13 rows.

The plurality of first punching holes 166a may be closer to the center plate 167 than to the left side of the inner plate 160. The plurality of second punching holes 166b may be closer to the center plate 167 than to the right side of the inner plate 160.

A cut-out 164 may be formed in the upper side of the flat plate portion 161 of the inner plate 160. There may be a plurality of cutouts 164, and the plurality of cutouts 164 may be formed while being spaced apart at regular intervals along the upper side of the flat plate portion 161 of the inner plate 160.

Accordingly, while the display device is curved, curvature matching may be improved. For example, the curvature may be 800R or 1000R.

Figure 22:
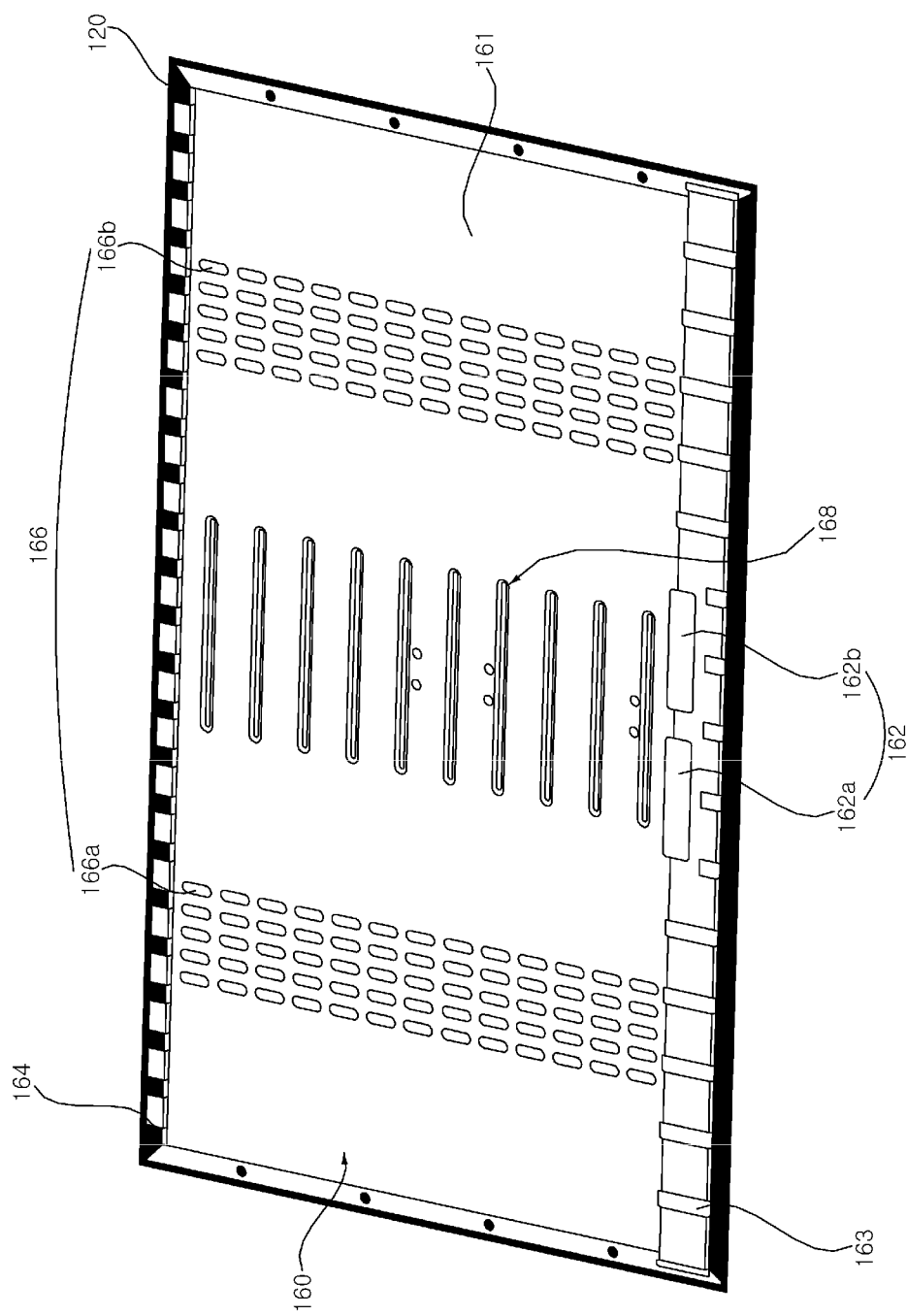
Figure 23:
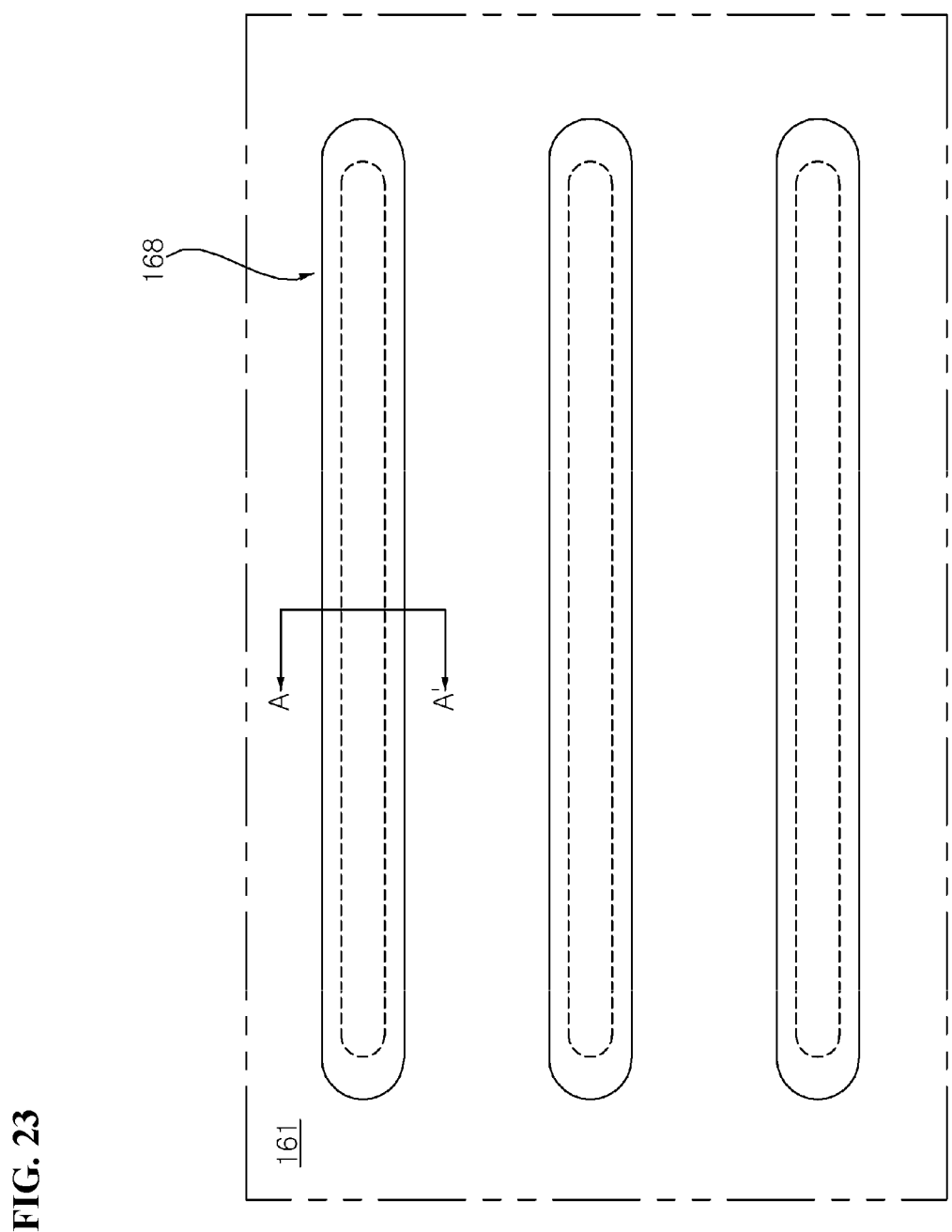
Figure 24:
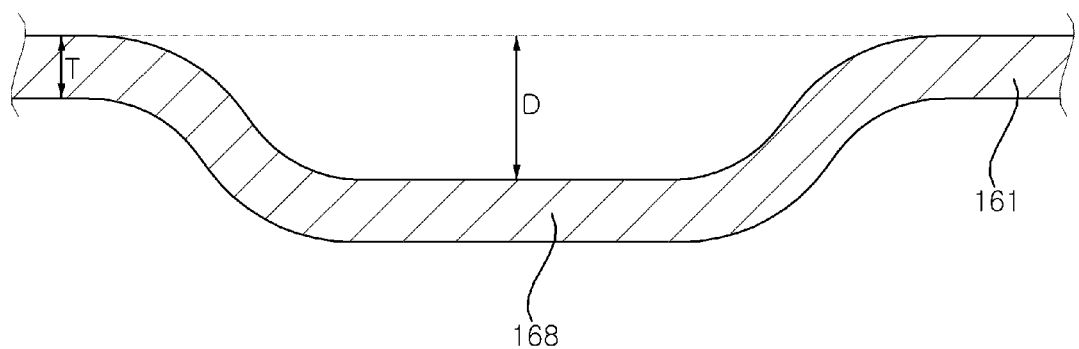

Referring to FIGS. 22 to 24, the inner plate 160 may be located between the plate 120 and the display panel 110 (see FIG. 2). The inner plate 160 may be coupled to or fixed to the plate 120.

A pressed part 168 may extend long in the left-right direction. The pressed part 168 may be formed by being recessed while the flat plate portion 161 of the inner plate 160 is pressed. The pressed part 168 may be sequentially disposed while being spaced apart from each other in the up-down direction of the inner plate 160. The pressed part 168 may reinforce the rigidity of the inner plate 160 and maintain the flexibility of the inner plate 160.

The cable hole 162 may penetrate the flat plate portion 161 of the inner plate 160 and be formed on the flat plate portion 161 of the inner plate 160. The cable hole 162 may extend long in the left and right directions. The cable hole 162 may be formed adjacent to the lower side of the inner plate 160. The plurality of cable holes 162 may be adjacent to the center of the inner plate 160 and located adjacent to each other.

The length of the pressed part 168 may correspond to the length of the cable holes 162. The length of the pressed part 168 may be smaller than the distance between both ends of the cable holes 162.

A plurality of accommodating holes 163 may be formed by penetrating the inner plate 160 along the lower side of the inner plate 160. For example, the source PCB of the display panel 110 may be received and located in the accommodating hole 163.

The punching hole 166 may be formed in the flat plate portion 161 of the inner plate 160. There may be a plurality of punching holes 166. The plurality of punching holes 166 may include a plurality of first punching holes 166a and a plurality of second punching holes 166b. The punching hole 166 may be a long hole extending long in the up-down direction.

The plurality of first punching holes 166a may be located between the pressed part 168 and the left side of the inner plate 160. The plurality of second punching holes 166b may be located between the pressed part 168 and the right side of the inner plate 160. For example, the punching holes 166 may form 5 columns. For another example, the punching holes 166 may form 13 rows.

The plurality of first punching holes 166a may be closer to the pressed part 168 than to the left side of the inner plate 160. The plurality of second punching holes 166b may be closer to the pressed part 168 than the right side of the inner plate 160.

A cut-out 164 may be formed on the upper side of the flat plate portion 161 of the inner plate 160. There may be a plurality of cutouts 164, and the plurality of cutouts 164 may be formed while being spaced apart at regular intervals along the upper side of the flat plate portion 161 of the inner plate 160.

The depth D of the pressed part 168 may be 1.3 to 1.5 times the thickness of the flat plate portion 161 of the inner plate 160. The pressed part 168 may reinforce the rigidity of the inner plate 160 and maintain the flexibility of the inner plate 160.

Accordingly, while the display device is curved, curvature matching may be improved. For example, the curvature may be 800R or 1000R.

Referring to FIGS. 1 to 24, the display device includes a flexible display panel 110; a flexible rear plate 120 which is located in a rear of the display panel 110, and coupled to the display panel 110; a flexible inner plate 160 coupled to the rear plate 120, at between the rear plate 120 and the display panel 110; a driving module 130 which is coupled to a rear of the rear plate 120, and has a slider 134a linearly reciprocating; a wing 140 which extends long, has one end coupled to the slider 134a, has the other end coupled to the rear of the rear plate 120, and has a pivot shaft located adjacent to the one end at between the one end and the other end; and a wing bracket 131, 132 which is adjacent to the pivot shaft and fixed to the rear of the rear plate 120, coupled to the pivot shaft, wherein the inner plate 160 includes a plurality of cutting lines 165 which are located between one end and the other end of the wing 140, and formed by cutting out a front surface of the inner plate 160, wherein the plurality of cutting lines 165 are elongated in a direction intersecting a longitudinal direction of the wing 140.

The display panel 110 includes: a left side SS1; and a right side SS2 facing the left side SS1, wherein the wing 140 includes a first wing 143 which has one end coupled to the slider 134a, has the other end adjacent to the left side SS1, and is fixed to the rear of the rear plate 120; and a second wing 141 which has one end coupled to the slider 134a, has the other end adjacent to the right side SS2, and is fixed to the rear of the rear plate 120, wherein the plurality of cutting lines 165 include: a plurality of first cutting lines 165 located between the other end of the first wing 143 and the slider 134a; and a plurality of second cutting lines 165 located between the other end of the second wing 141 and the slider 134a.

The first plurality of cutting lines 165 are symmetrical with the second plurality of cutting lines 165 with respect to the slider 134a.

In the plurality of cutting lines 165, a cross section of the inner plate 160 forms a quadrangle in a direction intersecting the longitudinal direction.

In the plurality of cutting lines 165, a cross section of the inner plate 160 forms a triangle in a direction intersecting the longitudinal direction.

In the plurality of cutting lines 165, a cross section of the inner plate 160 forms a trapezoid in a direction intersecting the longitudinal direction.

A thickness of the inner plate 160 is 1.3 to 1.7 times a depth of the plurality of cutting lines 165. The inner plate 160 further includes a plurality of cutouts 164 which are spaced apart from each other along an upper side of the inner plate 160 and sequentially formed. The inner plate 160 further includes a plurality of accommodating holes 163 which are spaced apart from each other along a lower side of the inner plate 160 and sequentially formed.

The driving module 130 includes: a front bracket 130F fixed to the rear of the rear plate 120; a rear bracket 130R facing the front bracket 130F; and a lead screw 133 which is elongated from the front bracket 130F toward the rear bracket 130R, and is rotatably coupled to the front bracket 130F or the rear bracket 130R, wherein the slider 134a is threaded with the lead screw 133 and performs a linear reciprocating motion.

The driving module 130 further includes: a first guide shaft 135a which is parallel to the lead screw 133, and fixed to the front bracket 130F or the rear bracket 130R; and a second guide shaft 135b which is parallel to the lead screw 133, is fixed to the front bracket 130F or the rear bracket 130R, and faces the first guide shaft 135a with respect to the lead screw 133.

The driving module 130 further includes a slider 134a guide into which the first guide shaft 135a and the second guide shaft 135b are inserted, and which is movable on the first guide shaft 135a and the second guide shaft 135b, and is fixed to the slider 134a.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device comprising:
 a flexible display panel;
 a flexible rear plate located at a rear of the display panel and coupled to the display panel;
 a flexible inner plate coupled to the rear plate between the rear plate and the display panel;
 a driving module coupled to a rear of the rear plate and including a slider, the slider being configured to reciprocate linearly;
 a wing, the wing being elongated and including one end coupled to the slider, an other end coupled to the rear of the rear plate, and a pivot shaft located adjacent to the one end between the one end and the other end; and
 a wing bracket adjacent to the pivot shaft, the wing bracket being fixed to the rear of the rear plate and coupled to the pivot shaft,
 wherein the inner plate comprises a plurality of cutting lines located between the one end and the other end of the wing and formed by cutting out a front surface of the inner plate,
 wherein the plurality of cutting lines are elongated in a direction intersecting a longitudinal direction of the wing,
 wherein the driving module comprises:
 a front bracket fixed to the rear of the rear plate;
 a rear bracket facing the front bracket; and a lead screw, the lead screw being elongated from the front bracket toward the rear bracket, and being rotatably coupled to the front bracket or the rear bracket, and wherein the slider is threaded with the lead screw to perform linear reciprocating motion.

2. The display device of claim 1, wherein the display panel comprises:

a left side; and a right side facing the left side, wherein the wing comprises:

a first wing including the one end coupled to the slider and the other end adjacent to the left side, wherein the other end of the first wing is fixed to the rear of the rear plate; and a second wing including the one end coupled to the slider and the other end adjacent to the right side, wherein the other end of the second wing is fixed to the rear of the rear plate, and wherein the plurality of cutting lines comprise:

a plurality of first cutting lines located between the other end of the first wing and the slider; and a plurality of second cutting lines located between the other end of the second wing and the slider.

3. The display device of claim 2, wherein the first plurality of cutting lines are symmetrical with the second plurality of cutting lines with respect to the slider.

4. The display device of claim 2, wherein, in the plurality of cutting lines, a cross section of the inner plate forms a quadrangle in a direction intersecting the longitudinal direction.

5. The display device of claim 2, wherein, in the plurality of cutting lines, a cross section of the inner plate forms a triangle in a direction intersecting the longitudinal direction.

6. The display device of claim 2, wherein, in the plurality of cutting lines, a cross section of the inner plate forms a trapezoid in a direction intersecting the longitudinal direction.

7. The display device of claim 1, wherein a thickness of the inner plate is 1.3 to 1.7 times a depth of the cutting line.

8. The display device of claim 1, wherein the inner plate further comprises a plurality of cutouts which are spaced apart from each other along an upper side of the inner plate and sequentially formed.

9. The display device of claim 8, wherein the inner plate further comprises a plurality of accommodating holes which are spaced apart from each other along a lower side of the inner plate and sequentially formed.

10. The display device of claim 1, wherein the driving module further comprises:

a first guide shaft which is parallel to the lead screw, and fixed to the front bracket or the rear bracket; and a second guide shaft which is parallel to the lead screw, is fixed to the front bracket or the rear bracket, and is opposite to the first guide shaft with respect to the lead screw.

11. The display device of claim 10, wherein the driving module further comprises a slider guide into which the first guide shaft and the second guide shaft are inserted, and which is movable on the first guide shaft and the second guide shaft, and is fixed to the slider.

* * * * *